United States Patent
Park et al.

(10) Patent No.: US 10,777,920 B2
(45) Date of Patent: Sep. 15, 2020

(54) CONNECTING DEVICE AND ELECTRONIC DEVICE INCLUDING THE SAME

(71) Applicants: Samsung Electronics Co., Ltd., Gyeonggi-do (KR); HYUPJINCONNECTOR Co., Ltd, Gyeonggi-do (KR)

(72) Inventors: Sung-Won Park, Gyeonggi-do (KR); Jae-Woon Lee, Gyeonggi-do (KR); Yang-Jean Park, Gyeonggi-do (KR); Jong-Sun Kim, Gyeongsangbuk-do (KR); Jin-Woo Park, Gyeonggi-do (KR); Myung-Suk Bae, Gyeonggi-do (KR); Seung-Yup Lee, Gyeonggi-do (KR); Jae-Ryong Han, Hwaseong-si (KR); Jang-Won Hur, Seoul (KR)

(73) Assignees: Samsung Electronics Co., Ltd., Yeongtong-gu, Suwon-si, Gyeonggi-do (KR); HYUPJINCONNECTOR Co., Ltd., Danwon-gu, Ansan-si, Gyeonggi-do (KR)

( * ) Notice: Subject to any disclaimer, the term of this patent is extended or adjusted under 35 U.S.C. 154(b) by 0 days.

(21) Appl. No.: 16/002,108

(22) Filed: Jun. 7, 2018

(65) Prior Publication Data
US 2018/0358722 A1 Dec. 13, 2018

(30) Foreign Application Priority Data
Jun. 9, 2017 (KR) .................. 10-2017-0072654

(51) Int. Cl.
*H01R 12/51* (2011.01)
*H05K 5/00* (2006.01)
(Continued)

(52) U.S. Cl.
CPC ........... *H01R 12/51* (2013.01); *H01R 12/718* (2013.01); *H01R 13/2428* (2013.01);
(Continued)

(58) Field of Classification Search
CPC .. H01R 12/51; H01R 12/718; H01R 13/2428; H01R 2101/00; H01R 2201/16;
(Continued)

(56) References Cited

U.S. PATENT DOCUMENTS

| 6,489,555 | B1* | 12/2002 | Horng | H05K 9/0016 |
| | | | | 174/361 |
| 6,863,540 | B2* | 3/2005 | Spykerman | H01R 13/2407 |
| | | | | 439/66 |

(Continued)

FOREIGN PATENT DOCUMENTS

| KR | 10-2012-0124213 A | 11/2012 |
| KR | 10-2015-0135124 A | 12/2015 |
| KR | 10-2016-0117136 A | 10/2016 |

*Primary Examiner* — Rockshana D Chowdhury
(74) *Attorney, Agent, or Firm* — Cha & Reiter, LLC.

(57) ABSTRACT

According to an embodiment of the present disclosure, a connecting device included in an electronic device may comprise a movable part including at least one contacting part, an elastic part extending from the movable part and including a plurality of bends alternately arranged to allow the movable part to move in a first direction, and a support extending from the elastic part. Other various embodiments are also possible.

16 Claims, 16 Drawing Sheets

(51) Int. Cl.
*H01R 12/71* (2011.01)
*H04M 1/02* (2006.01)
*H01R 13/24* (2006.01)
*H01Q 1/24* (2006.01)
*H01R 101/00* (2006.01)
*H01R 12/57* (2011.01)
*H01R 13/03* (2006.01)

(52) U.S. Cl.
CPC ........ *H04M 1/0202* (2013.01); *H05K 5/0069* (2013.01); *H01Q 1/243* (2013.01); *H01R 12/57* (2013.01); *H01R 13/03* (2013.01); *H01R 13/2492* (2013.01); *H01R 2101/00* (2013.01); *H01R 2201/16* (2013.01)

(58) Field of Classification Search
CPC .... H01R 12/57; H01R 13/03; H01R 13/2492; H05K 5/0069; H01Q 1/243
USPC ......................................................... 361/809
See application file for complete search history.

(56) References Cited

U.S. PATENT DOCUMENTS

| | | | | |
|---|---|---|---|---|
| 6,872,881 | B2* | 3/2005 | Horng | H05K 9/0035 |
| | | | | 174/384 |
| 8,052,428 | B2* | 11/2011 | Tsao | H01R 13/24 |
| | | | | 439/66 |
| 8,282,430 | B2* | 10/2012 | He | H01B 5/00 |
| | | | | 439/862 |
| 9,543,681 | B2* | 1/2017 | Chen | H01R 13/2457 |
| 2007/0197099 | A1* | 8/2007 | DiStefano | H01R 13/2407 |
| | | | | 439/620.1 |
| 2014/0132460 | A1* | 5/2014 | Cho | H01Q 1/28 |
| | | | | 343/702 |
| 2015/0340789 | A1 | 11/2015 | Yokota et al. | |
| 2016/0172776 | A1* | 6/2016 | Kato | H01R 13/4538 |
| | | | | 439/700 |
| 2017/0054199 | A1* | 2/2017 | Gang | H01Q 21/28 |

* cited by examiner

CONNECTING DEVICE AND ELECTRONIC DEVICE INCLUDING THE SAME

CROSS-REFERENCE TO RELATED APPLICATION(S)

This application claims the benefit under 35 U.S.C. § 119(a) of a Korean patent application filed in the Korean Intellectual Property Office on Jun. 9, 2017 and assigned Serial No. 10-2017-0072654, the entire disclosure of which is incorporated herein by reference.

TECHNICAL FIELD

Various embodiments of the present disclosure relate to connecting devices and electronic devices including the same.

BACKGROUND

Electronic device means a device performing a particular function according to its equipped program, such as a home appliance, an electronic scheduler, a portable multimedia player, a mobile communication terminal, a tablet PC, a video/sound device, a desktop PC or laptop computer, a navigation for automobile, etc. For example, electronic devices may output stored information as voices or images. As electronic devices are highly integrated and high-speed, high-volume wireless communication becomes commonplace, electronic devices are recently coming with various features. For example, an electronic device comes with the integrated functionality, including an entertainment function, such as playing video games, a multimedia function, such as replaying music/videos, a communication and security function for mobile banking, and a scheduling or e-wallet function.

Electronic devices may include connecting devices for connection between electronic parts or between the electronic parts and circuit boards. Electronic device are subject to corrosion between electronic parts and circuit boards.

The above information is presented as background information only to assist with an understanding of the present disclosure. No determination has been made, and no assertion is made, as to whether any of the above might be applicable as prior art with regard to the present disclosure.

SUMMARY

A connecting device may include a bottom plate affixed to a board and a movable part configured to be movable and contacting a target. The movable part may be overall formed in a C-clip shape. The movable part may include a contacting part directly contacting an electronic part and an elastic part that may impart an elastic force to the contacting part as the contacting part is contacted.

Where the target moves, the part of the C clip-shaped connecting device, which contacts the target, may move along the vertical and horizontal directions, causing surface wear to the target and hence fretting corrosion. Fretting corrosion may include granules produced by the surface wear oxidizing the surface of the target, accelerating the corrosion to the surface. As the surface of the target corrodes, the resistance may drastically rise or the contact between the target and the contacting part may be subjected to an unstable state.

According to an embodiment of the present disclosure, there may be provided a connecting device capable of reducing wear to the surface of the target by restricting its horizontal movement while allowing it to move in the horizontal direction when the connecting device is caused to move.

According to an embodiment of the present disclosure, there may be provided a connecting device that may be more resistant to corrosion.

According to an embodiment of the present disclosure, a connecting device may comprise a movable part including at least one electrical contact, an elastic part connected to and extending from the movable part and including a plurality of bends alternately arranged to allow the movable part to move in a first direction, and a support extending from the elastic part.

According to an embodiment of the present disclosure, an electronic device including a connecting device may comprise a housing including a first surface, a second surface positioned opposite the first surface, and a side part connecting the first surface with the second surface, a connecting part protruding from the side part to an inside of the housing, a circuit board disposed inside the housing, and the connecting device electrically connecting the connecting part with the circuit board, wherein the connecting device may include a movable part including at least one electrical contact, an elastic part connected to and extending from the movable part and including a plurality of bends alternately arranged to allow the movable part to move in a first direction, and a support extending from the elastic part.

According to an embodiment of the present disclosure, a method for manufacturing an electronic device including a connecting device may comprise preparing a housing including a first surface, a second surface positioned opposite the first surface, a side part connecting the first surface with the second surface, and a connecting part protruding inward from the side part, disposing a circuit board, on which the connecting device is mounted, in the housing, the connecting device including a movable part and an elastic part configured to alternately provide elastic forces to the movable part to allow the movable part to move in a first direction, and connecting the connecting device to the connecting part of the housing.

Other aspects, advantages, and salient features of the disclosure will become apparent to those skilled in the art from the following detailed description, which, taken in conjunction with the annexed drawings, discloses exemplary embodiments of the disclosure.

BRIEF DESCRIPTION OF THE DRAWINGS

A more complete appreciation of the present disclosure and many of the attendant aspects thereof will be readily obtained as the same becomes better understood by reference to the following detailed description when considered in connection with the accompanying drawings, wherein.

Throughout the drawings, like reference numerals will be understood to refer to like parts, components, and structures.

DETAILED DESCRIPTION

Figure 1:
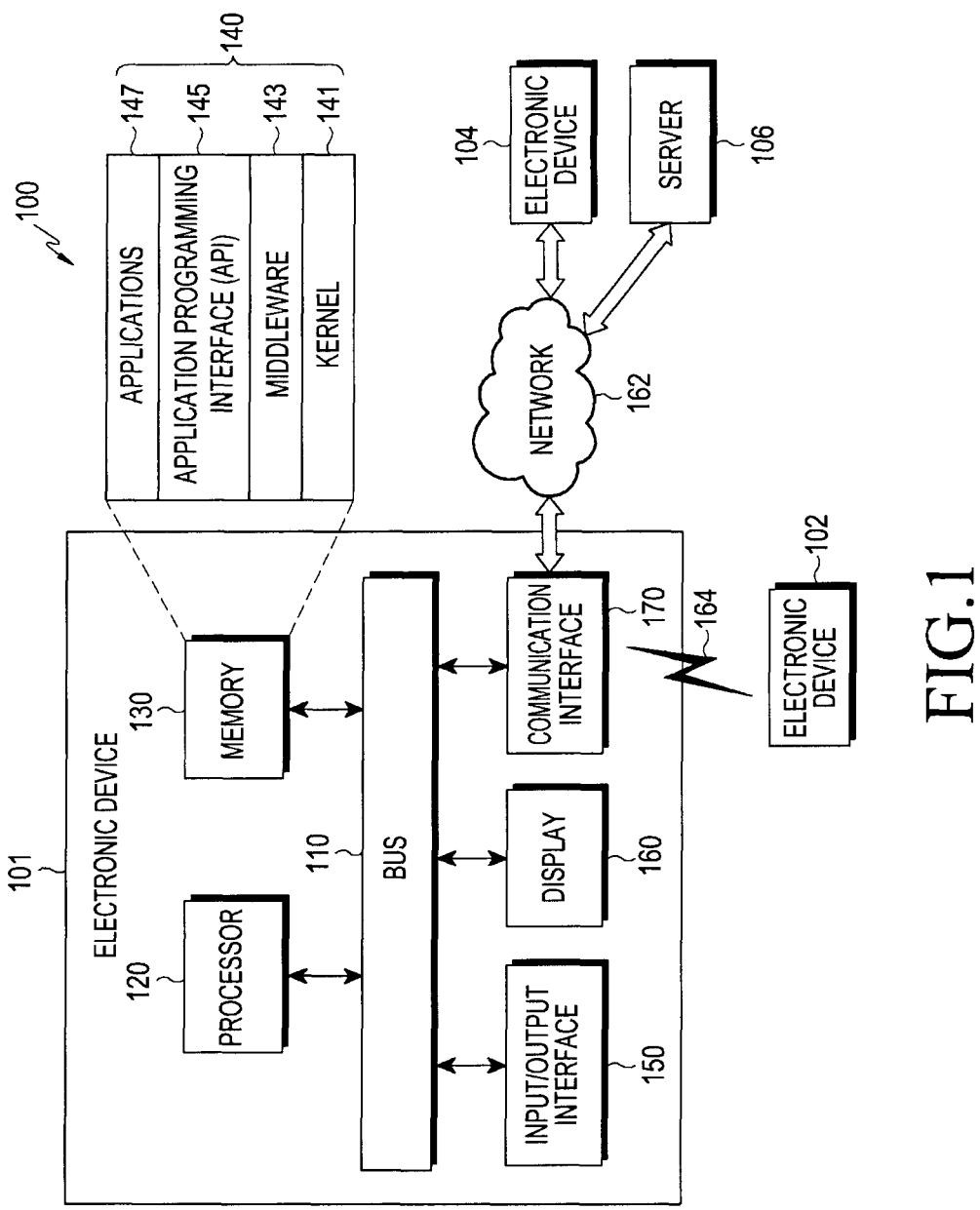
FIG. 1 is a view schematically illustrating an electronic device in a network environment according to an embodiment of the present disclosure.

Hereinafter, embodiments of the present disclosure are described with reference to the accompanying drawings. However, it should be appreciated that the present disclosure is not limited to the embodiments and the terminology used herein, and all changes and/or equivalents or replacements thereto also belong to the scope of the present disclosure. The same or similar reference denotations may be used to refer to the same or similar elements throughout the specification and the drawings. It is to be understood that the singular forms "a," "an," and "the" include plural references unless the context clearly dictates otherwise. As used herein, the terms "A or B" or "at least one of A or B" may include all possible combinations of A and B. As used herein, the terms "first" and "second" may modify various components regardless of importance and/or order and are used to distinguish a component from another without limiting the components. It will be understood that when an element (e.g., a first element) is referred to as being (operatively or communicatively) "coupled with/to," or "connected with/to" another element (e.g., a second element), it can be coupled or connected with/to the other element directly or via a third element.

As used herein, the terms "configured to" may be interchangeably used with other terms, such as "suitable for," "capable of," "modified to," "made to," "adapted to," "able to," or "designed to" in hardware or software in the context. Rather, the term "configured to" may mean that a device can perform an operation together with another device or parts. For example, the term "processor configured (or set) to perform A, B, and C" may mean a generic-purpose processor (e.g., a CPU or application processor) that may perform the operations by executing one or more software programs stored in a memory device or a dedicated processor (e.g., an embedded processor) for performing the operations.

For example, examples of the electronic device according to embodiments of the present disclosure may include at least one of a smartphone, a tablet personal computer (PC), a mobile phone, a video phone, an e-book reader, a desktop PC, a laptop computer, a netbook computer, a workstation, a server, a personal digital assistant (PDA), a portable multimedia player (PMP), a MP3 player, a medical device, a camera, or a wearable device. The wearable device may include at least one of an accessory-type device (e.g., a watch, a ring, a bracelet, an anklet, a necklace, glasses, contact lenses, or a head-mounted device (HMD)), a fabric- or clothes-integrated device (e.g., electronic clothes), a body attaching-type device (e.g., a skin pad or tattoo), or a body implantable device. In some embodiments, examples of the smart home appliance may include at least one of a television, a digital video disk (DVD) player, an audio player, a refrigerator, an air conditioner, a cleaner, an oven, a microwave oven, a washer, a drier, an air cleaner, a set-top box, a home automation control panel, a security control panel, a TV box (e.g., Samsung HomeSync™, Apple TV™, or Google TV™), a gaming console (Xbox™, PlayStation™), an electronic dictionary, an electronic key, a camcorder, or an electronic picture frame.

According to an embodiment of the present disclosure, the electronic device may include at least one of various medical devices (e.g., diverse portable medical measuring devices (a blood sugar measuring device, a heartbeat measuring device, or a body temperature measuring device), a magnetic resource angiography (MRA) device, a magnetic resource imaging (MRI) device, a computed tomography (CT) device, an imaging device, or an ultrasonic device), a navigation device, a global navigation satellite system (GNSS) receiver, an event data recorder (EDR), a flight data recorder (FDR), an automotive infotainment device, an sailing electronic device (e.g., a sailing navigation device or a gyro compass), avionics, security devices, vehicular head units, industrial or home robots, drones, automatic teller's machines (ATMs), point of sales (POS) devices, or interne of things (IoT) devices (e.g., a bulb, various sensors, a sprinkler, a fire alarm, a thermostat, a street light, a toaster, fitness equipment, a hot water tank, a heater, or a boiler). According to various embodiments of the disclosure, examples of the electronic device may at least one of part of a piece of furniture, building/structure or vehicle, an electronic board, an electronic signature receiving device, a projector, or various measurement devices (e.g., devices for measuring water, electricity, gas, or electromagnetic waves). According to embodiments of the present disclosure, the electronic device may be flexible or may be a combination of the above-enumerated electronic devices. According to an embodiment of the present disclosure, the electronic device is not limited to the above-listed embodiments. As used herein, the term "user" may denote a human or another device (e.g., an artificial intelligent electronic device) using the electronic device.

FIG. 1 is a view schematically illustrating an electronic device in a network environment according to an embodiment of the present disclosure.

Referring to FIG. 1, according to an embodiment of the present disclosure, an electronic device 100 is included in a present disclosure. The electronic device 101 may include a bus 110, a processor 120, a memory 130, an input/output interface 150, a display 160, and a communication interface 170. In some embodiments, the electronic device 101 may exclude at least one of the components or may add another component. The bus 110 may include a circuit for connecting the components 110 to 170 with one another and transferring communications (e.g., control messages or data) between the components. The processor 120 may include one or more of a central processing unit (CPU), an application processor (AP), or a communication processor (CP). The processor 120 may perform control on at least one of the other components of the electronic device 101 or perform an operation or data processing relating to communication.

The memory 130 may include a volatile or non-volatile memory. For example, the memory 130 may store commands or data related to at least one other component of, e.g., the electronic device 101. According to an embodiment of the present disclosure, the memory 130 may store software or a program 140. The program 140 may include, e.g., a kernel 141, middleware 143, an application programming interface (API) 145, or an application program (or "application") 147. At least a portion of the kernel 141, middleware 143, or API 145 may be denoted an operating system (OS). For example, the kernel 141 may control or manage system resources (e.g., the bus 110, processor 120, or a memory 130) used to perform operations or functions implemented in other programs (e.g., the middleware 143, API 145, or application program 147). The kernel 141 may provide an interface that allows the middleware 143, the API 145, or the application 147 to access the individual components of the electronic device 101 to control or manage the system resources.

The middleware 143 may function as a relay to allow the API 145 or the application 147 to communicate data with the kernel 141, for example. Further, the middleware 143 may process one or more task requests received from the application program 147 in order of priority. For example, the middleware 143 may assign a priority of using system resources (e.g., bus 110, processor 120, or memory 130) of the electronic device 101 to at least one of the application programs 147 and process one or more task requests. The API 145 is an interface allowing the application 147 to control functions provided from the kernel 141 or the middleware 143. For example, the API 133 may include at least one interface or function (e.g., a command) for filing control, window control, image processing or text control. For example, the input/output interface 150 may transfer commands or data input from the user or other external device to other component(s) of the electronic device 101 or may output commands or data received from other component(s) of the electronic device 101 to the user or other external devices.

The display 160 may include, e.g., a liquid crystal display (LCD), a light emitting diode (LED) display, an organic light emitting diode (OLED) display, or a microelectromechanical systems (MEMS) display, an electronic paper display, or a touchscreen display. The display 160 may display, e.g., various contents (e.g., text, images, videos, icons, or symbols) to the user. The display 160 may include a touchscreen display and may receive, e.g., a touch, gesture, proximity or hovering input using an electronic pen or a body portion of the user.

For example, the communication interface 170 may set up communication between the electronic device 101 and an external electronic device (e.g., a first electronic device 102, a second electronic device 104, or a server 106). For example, the communication interface 170 may be connected with the network 162 through wireless or wired communication to communicate with the external electronic device (e.g., the second external electronic device 104 or server 106). The wireless communication circuit may include the communication interface 170.

The wireless communication may include cellular communication which uses at least one of, e.g., long term evolution (LTE), long term evolution-advanced (LTE-A), code division multiple access (CDMA), wideband code division multiple access (WCDMA), universal mobile telecommunication system (UMTS), wireless broadband (WiBro), or global system for mobile communication (GSM). According to an embodiment of the present disclosure, the wireless communication may include at least one of, e.g., wireless-fidelity (Wi-Fi), light-fidelity (Li-Fi), bluetooth, bluetooth low power (BLE), zigbee, near-field communication (NFC), magnetic secure transmission (MST), radio frequency (RF), or body area network (BAN) as denoted with element 164 of FIG. 1. According to an embodiment of the present disclosure, the wireless communication may include global navigation satellite system (GNSS). The GNSS may be, e.g., global positioning system (GPS), global navigation satellite system (Glonass), Beidou navigation satellite system (hereinafter, "Beidou") or Galileo, or the european global satellite-based navigation system. Hereinafter, the terms "GPS" and the "GNSS" may be interchangeably used herein. The wired connection may include at least one of, e.g., universal serial bus (USB), high definition multimedia interface (HDMI), recommended standard (RS)-232, power line communication (PLC), or plain old telephone service (POTS). The network 162 may include at least one of telecommunication networks, e.g., a computer network (e.g., local area network (LAN) or wide area network (WAN)), Internet, or a telephone network.

The first and second external electronic devices 102 and 104 each may be a device of the same or a different type from the electronic device 101. According to an embodiment of the present disclosure, all or some of operations executed on the electronic device 101 may be executed on another or multiple other electronic devices (e.g., the electronic devices 102 and 104 or server 106). According to an embodiment of the present disclosure, when the electronic device 101 should perform some function or service automatically or at a request, the electronic device 101, instead of executing the function or service on its own or additionally, may request another device (e.g., electronic devices 102 and 104 or server 106) to perform at least some functions associated therewith. The other electronic device (e.g., electronic devices 102 and 104 or server 106) may execute the requested functions or additional functions and transfer a result of the execution to the electronic device 101. The electronic device 101 may provide a requested function or service by processing the received result as it is or additionally. To that end, a cloud computing, distributed computing, or client-server computing technique may be used, for example.

Figure 2:
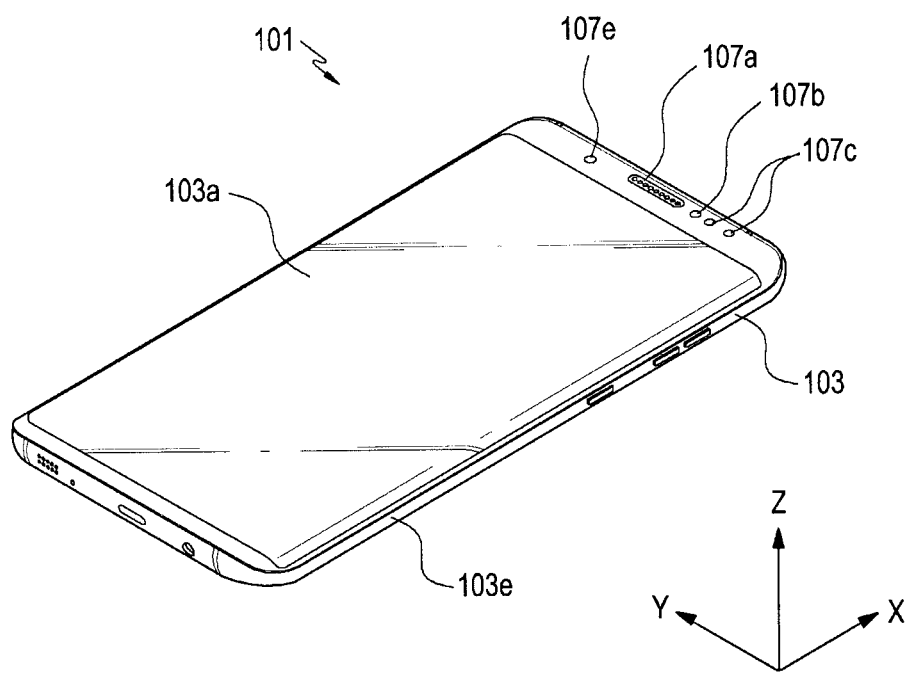
FIG. 2 is a front view illustrating an electronic device according to an embodiment of the present disclosure.
Figure 3:
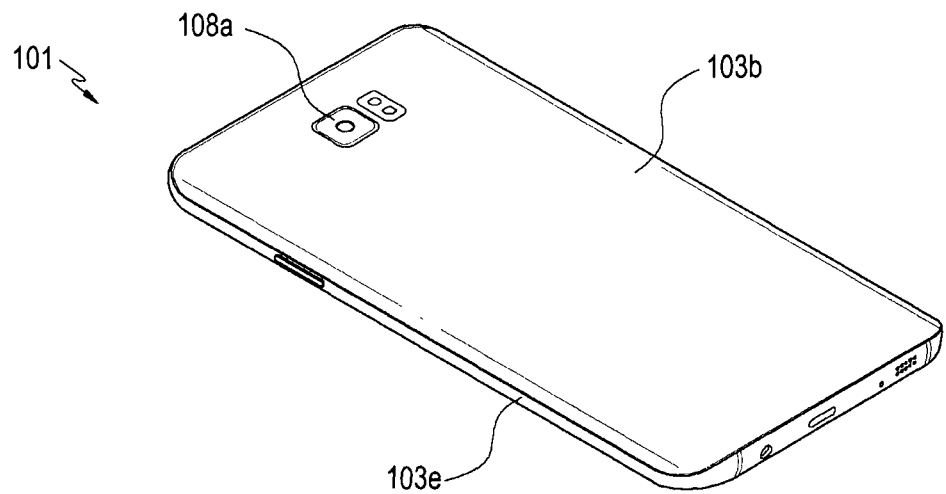
FIG. 3 is a rear view illustrating an electronic device according to an embodiment of the present disclosure.

FIG. 2 is a front, perspective view illustrating an electronic device (e.g., the electronic device 101 of FIG. 1) according to an embodiment of the present disclosure. FIG. 3 is a rear, perspective view illustrating an electronic device according to an embodiment of the present disclosure.

In the three-axis rectangular coordinate system as shown in FIG. 2, 'Y,' 'X,' and respectively, may denote the width, length, and height direction of the electronic device 101.

Referring to FIGS. 2 and 3, the electronic device 101 may include a housing 103. The housing 103 may include a first surface 103a facing in the first direction +Z, a second surface 103b facing in the second direction −Z which is opposite to the first direction +Z, and a side surface surrounding a space between the first surface 103a and the second surface 103b.

The housing 103 may have a front opening. A transparent cover may be provided to form at least part of the front surface 103a, closing the front opening of the front surface of the housing 103. According to an embodiment of the present disclosure, the transparent cover may be disposed over the whole front surface of the electronic device as viewed from above the first surface 103a.

According to an embodiment of the present disclosure, a keypad with mechanical buttons or touch keys may be provided in a lower area of the front surface (e.g., the first surface 103a) of the housing 103. The touch keys may generate input signals as they are touched by the user's body. According to an embodiment of the present disclosure, the keypad may be implemented to include only mechanical buttons or only the touch keys. Various circuit devices, e.g., the processor 120, the memory 130, the input/output interface 150, and the communication interface 170 described above, may be received inside the housing 103. A battery 109 may also be received in the housing 210 to secure power.

According to an embodiment of the present disclosure, a speaker 107e, a first camera 107a, an illumination sensor 107b, or a proximity sensor 107c may be provided in an upper area of the front surface (e.g., the first surface 103a) of the electronic device 103. According to an embodiment of the present disclosure, a second camera 108a, a flash, or a speaker may be provided in the rear surface (e.g., the second surface 103b) of the housing 103.

In order to place the various circuits, such as processor 120, memory 130, bus 110, display 160, communication interface 170 inside the housing 103, the foregoing electronic parts are placed on circuit boards. The electronic parts can form an electrical connection with an electrical contact of a moving part.

Figure 4:
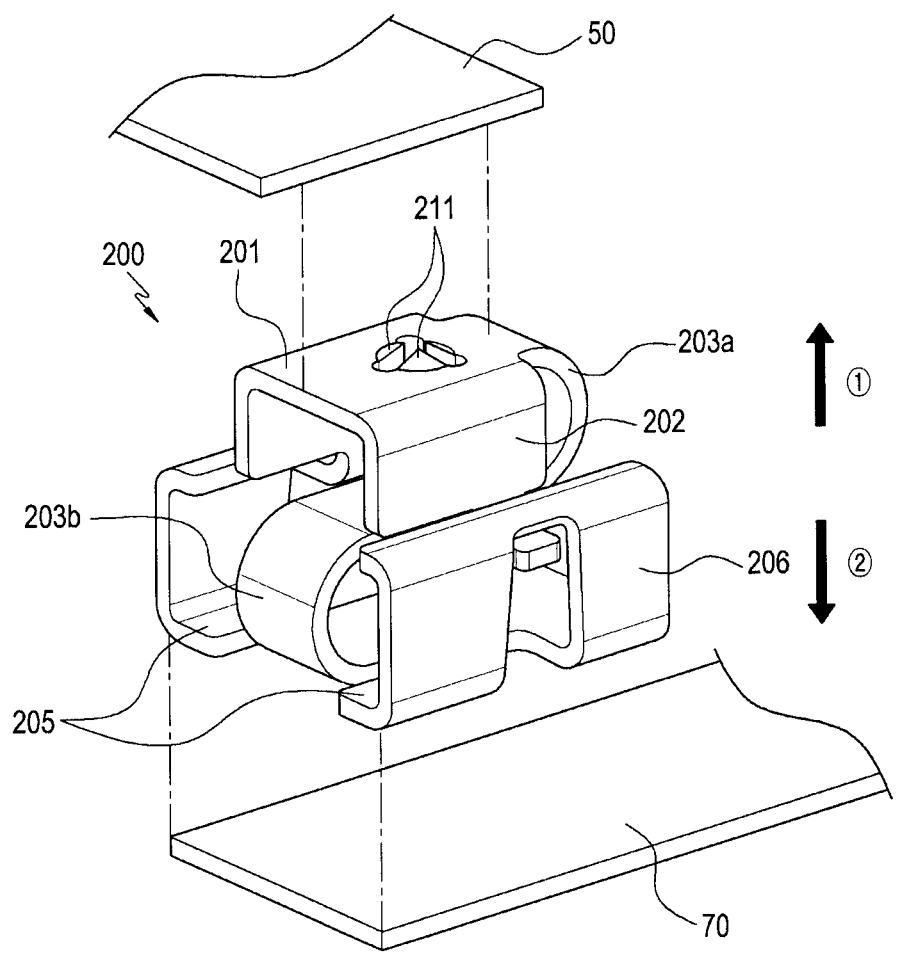
FIG. 4 is a perspective view illustrating a connecting device included in an electronic device according to an embodiment of the present disclosure.
Figure 5:
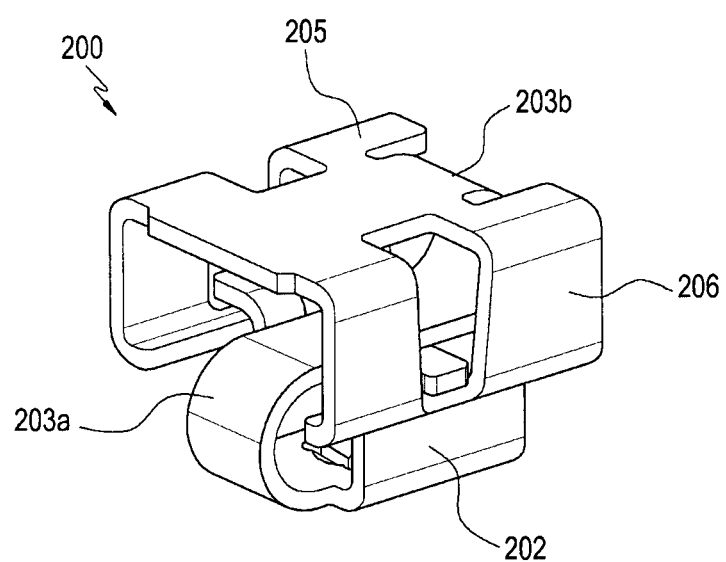
FIG. 5 is a perspective view illustrating a connecting device included in an electronic device, as viewed in a different direction, according to an embodiment of the present disclosure.

FIG. 4 is a perspective view illustrating a connecting device 200 included in an electronic device (e.g., the electronic device 101 of FIG. 2) according to an embodiment of the present disclosure. FIG. 5 is a perspective view illustrating a connecting device 200 included in an electronic device (e.g., the electronic device 101 of FIG. 2) according to an embodiment of the present disclosure.

Referring to FIGS. 4 and 5, according to an embodiment of the present disclosure, the connecting device 200 included in the electronic device (e.g., the electronic device 101 of FIG. 2) may be disposed inside the housing (e.g., the housing 103 of FIG. 2) of the electronic device (e.g., the electronic device 101 of FIG. 2) to electrically connect a connecting part 50 with a circuit board 70. For example, the connecting part 50 may be part of a side part (e.g., the side part 103e of FIG. 2) of the housing (e.g., the housing 103 of FIG. 2), and the circuit board 70 may be a circuit board mounted in the housing (e.g., the housing 103 of FIG. 2). The connecting device 200 may include a movable part 201, elastic parts 203a and 203b, and a support 205. The connecting part 50 can include, e.g., the processor, memory, bus, input/output interface, display, and communication interface, of FIG. 1.

According to an embodiment of the present disclosure, the movable part 201 may include electrical contacts 211 protruding from one surface of the movable part 201. The electrical contacts 211 may contact the rear surface of the connecting part 50. According to an embodiment of the present disclosure, one surface of the movable part 201 may be kept separated from the rear surface of the connecting part 50, thereby preventing corrosion due to contact with the contacting part 50.

According to an embodiment of the present disclosure, the elastic parts 203a and 203b may extend from the movable part 201 and may be shaped as the letter "S." The elastic parts 203a and 203b may provide elastic forces to the movable part 201 in a first direction ① which is perpendicular to one surface of the movable part 201. The elastic parts 203a and 203b may alternately provide elastic forces along the first direction ①, thus allowing the movable part 201 to move along a straight line. For example, where the movable part 201 is pressed or pulled by the connecting part 50, the movable part 201 is moved only in the first direction ① by the elastic parts 203a and 203b while being stopped from moving in the direction perpendicular to the first direction ①, allowing the movable part 201 to remain in the position where it is in contact with the connecting part 50.

According to an embodiment of the present disclosure, the support 205 may extend from the elastic part 203b and contact the circuit board 70. One of the support 205 of the connecting device 200 may be shaped as a plate. The support 205 may directly be mounted on a circuit board (e.g., the circuit board 70 of FIG. 4). The circuit board 70 may be electrically connected with the connecting part 50 through the support 205, the elastic parts 203a and 203b, and the movable part 201.

According to an embodiment of the present disclosure, the moving part 201 may include at least one first protecting wall 202. The at least one first protecting wall 202 may extend in a second direction ② that is opposite to the first direction ①. Like the first direction ①, the second direction ② may also be perpendicular to one surface of the movable part 201. The first protecting wall 202 is provided around the side surfaces of the elastic parts 203a and 203b, protecting the elastic parts 203a and 203b from external impacts.

According to an embodiment of the present disclosure, the connecting device 200 may include at least one second protecting wall 206. The at least one second protecting wall 206 may extend from the support 205 along the first direction ①. The second protecting wall 206, along with the first protecting wall 202, is provided around the side surfaces of the elastic parts 203a and 203b, protecting the elastic parts 203a and 203b from external impacts.

Figure 6:
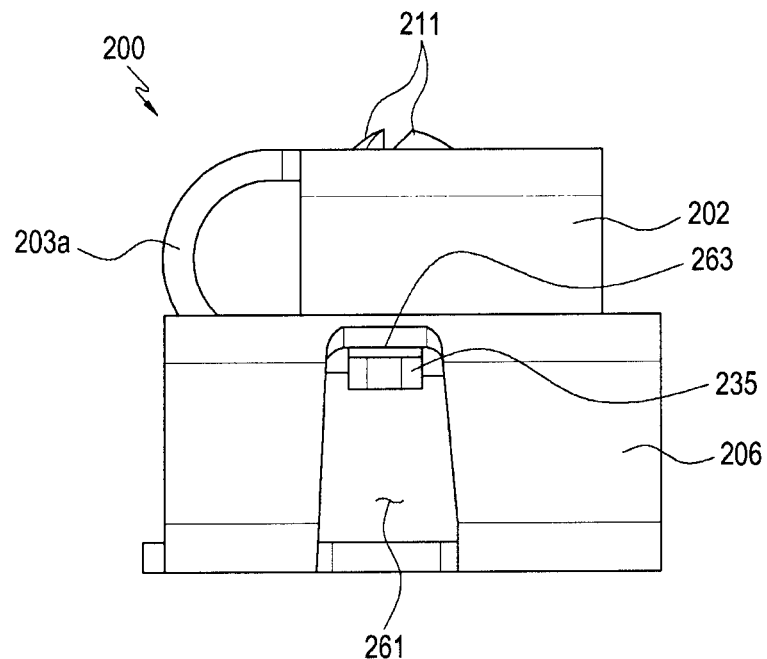
FIG. 6 is a side view illustrating a connecting device included in an electronic device according to an embodiment of the present disclosure.
Figure 7:
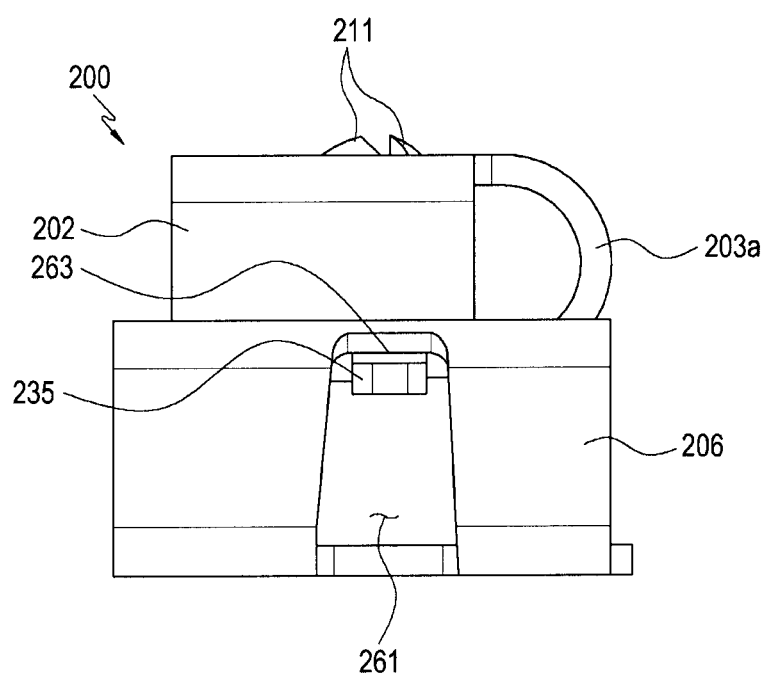
FIG. 7 is a side view illustrating a connecting device included in an electronic device, as viewed in a different direction, according to an embodiment of the present disclosure.

FIG. 6 is a side view illustrating a connecting device 200 included in an electronic device (e.g., the electronic device 101 of FIG. 2) according to an embodiment of the present disclosure. FIG. 7 is a side view illustrating a connecting device included in an electronic device, as viewed in a different direction, according to an embodiment of the present disclosure.

Referring to FIGS. 6 and 7, the connecting device 200 may include opening 261, ledge 263, and tab 235 to restrict the elastic parts 203a and 203b from moving in the first direction ①. The opening 261 may be formed in the second protecting wall 206 and may have a lengthwise direction along the first direction ①. The first tab 235 may extend from the first protecting wall 202 and may move along the opening 261 while being in the opening 261. The ledge 263 the portion of the second protecting wall 206 at the top of the opening 261. The tab 235 may be prevented or obstructed from extending past the ledge 263 along the first direction. As the first tab 235 is obstructed by the second hanging part 263, the plurality of elastic parts 203a and 203b connected to the movable part 201 through the first protecting wall 202 may be prevented from overly moving in the first direction ①.

Figure 8:
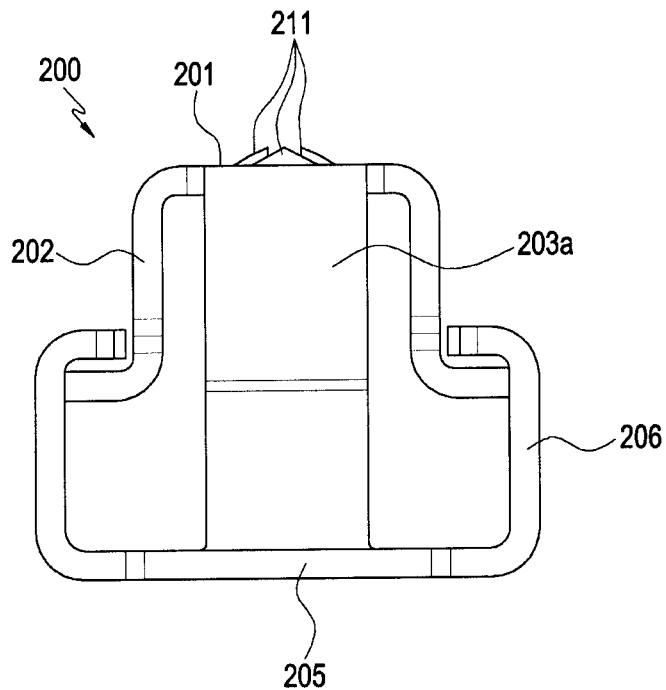
FIG. 8 is a side view illustrating a connecting device included in an electronic device, as viewed in a different direction, according to an embodiment of the present disclosure.

FIG. 8 is a side view illustrating a connecting device 200 included in an electronic device (e.g., the electronic device 101 of FIG. 2) according to an embodiment of the present disclosure.

Referring to FIG. 8, the first protecting wall 202 may be guided by the second protecting wall 206 and be thus moved in the second direction ②. As the first protecting wall 202 is guided by the second protecting wall 206, the first protecting wall 202 along with the first protecting wall 202 may be prevented from moving in the direction perpendicular to the second direction ②. For example, the movable part 201 may be moved together with the first protecting wall 202 while remaining perpendicular to the second direction ②.

Figure 9:
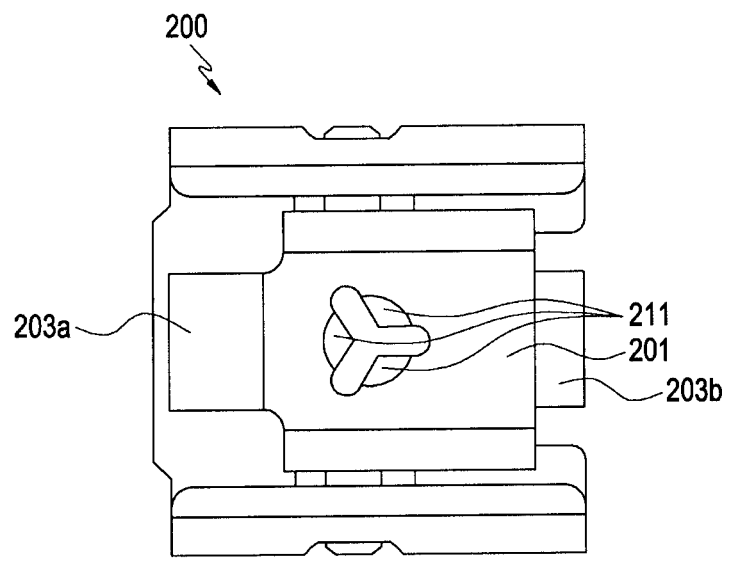
FIG. 9 is a plan view illustrating a connecting device included in an electronic device according to an embodiment of the present disclosure.

FIG. 9 is a plan view illustrating a connecting device 200 included in an electronic device (e.g., the electronic device 101 of FIG. 2) according to an embodiment of the present disclosure.

Referring to FIG. 9, the respective ends of the plurality of electrical contacts 211 may face each other. According to an embodiment of the present disclosure, the plurality of electrical contacts 211 may be formed to be symmetrical with each other or may also be formed in other various shapes.

Figure 10:
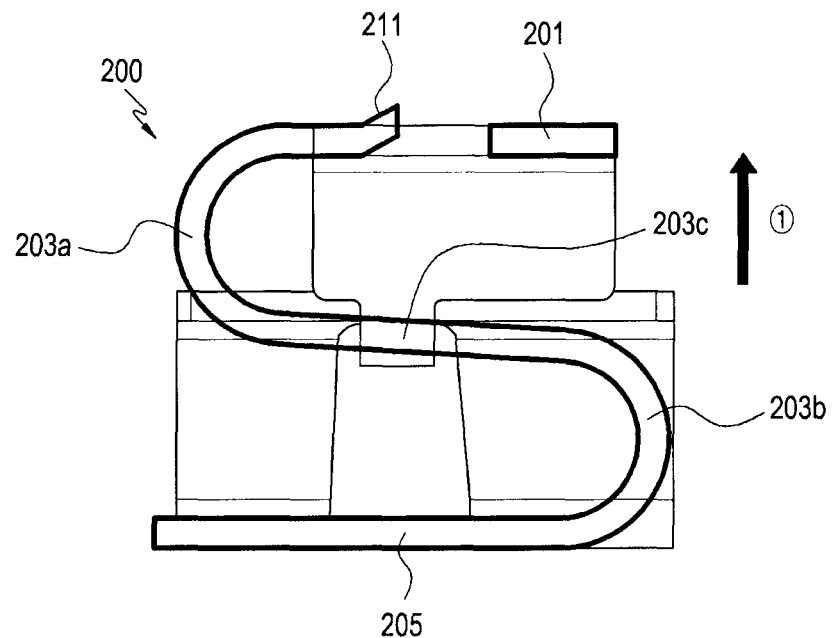
FIG. 10 is a cross-sectional view illustrating a connecting device included in an electronic device according to an embodiment of the present disclosure.

FIG. 10 is a cross-sectional view illustrating a connecting device 200 included in an electronic device (e.g., the electronic device 101 of FIG. 2) according to an embodiment of the present disclosure.

Referring to FIG. 10, the elastic parts 203a and 203b may be integrally formed with the movable part 201 and may also be integrally formed with the support 203. The elastic parts 203a and 203b may include a first bend 203a, a second bend 203b, and a bend connecting part 203c provided between the first bend 203a and the second bend 203b. The elastic parts 203a, 203b, and 203c may be shaped as the letter "S" and may provide elastic forces to the movable part 201 in the first direction ①. As the elastic parts 203a and 203b have an S shape, they may provide elastic forces to the movable part 201 so that one surface of the movable part 201 is perpendicular to the first direction ①. According to an embodiment of the present disclosure, the number of the plurality of bends 203a and 203b may be an even number. The plurality of bends 203a and 203b may alternately bend the bend connecting part 203c, preventing the plurality of electrical contacts 211 from moving in the direction perpendicular to the first direction ①.

Figure 11:
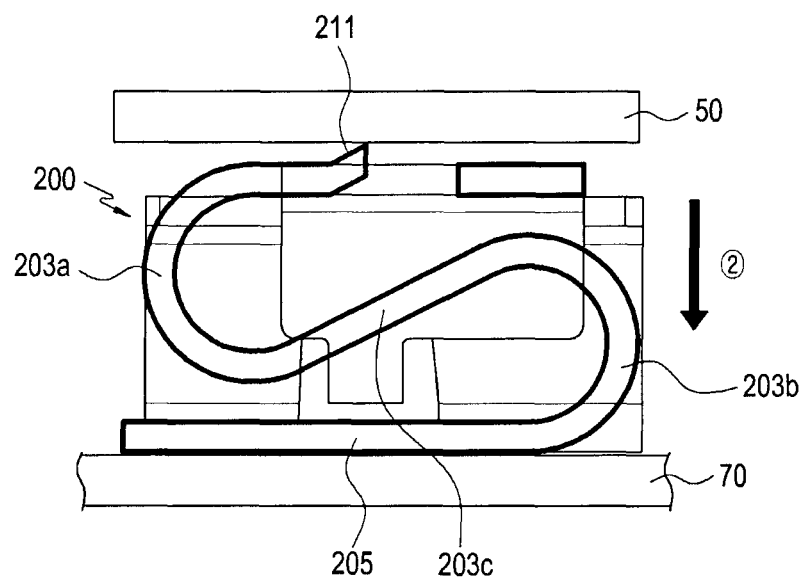
FIG. 11 is a cross-sectional view illustrating a connecting device included in an electronic device, which has been pressed in a second direction, according to an embodiment of the present disclosure.
Figure 12:
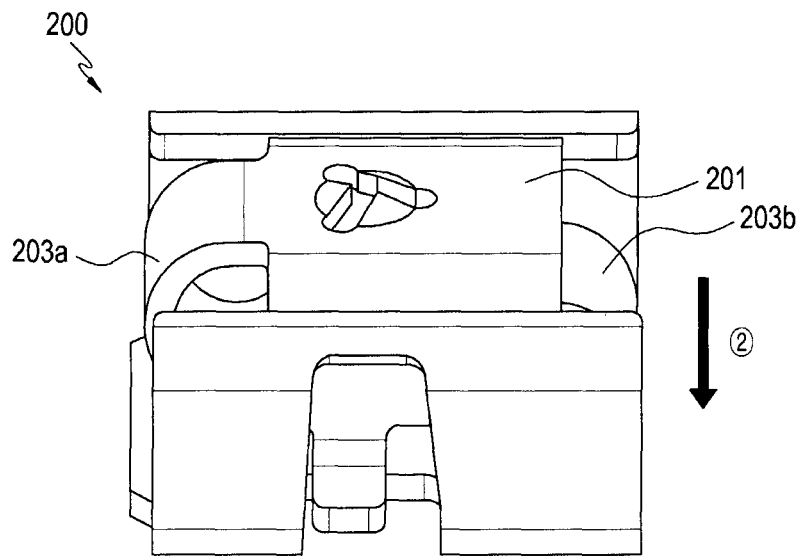
FIG. 12 is a perspective view illustrating a connecting device included in an electronic device, which has been pressed in the second direction, according to an embodiment of the present disclosure.

FIG. 11 is a cross-sectional view illustrating a connecting device 200 included in an electronic device (e.g., the electronic device 101 of FIG. 2), pressed in the second direction ②, according to an embodiment of the present disclosure. FIG. 12 is a perspective view illustrating a connecting device included in an electronic device, which has been pressed in the second direction, according to an embodiment of the present disclosure.

Referring to FIGS. 11 and 12, the connecting device 200 may be pressed in the second direction ② by the connecting part 50 while being seated on the circuit board 70. As the movable part 201 is pressured by the connecting part 50, the first and second bends 203a and 203b may bend the bend connecting part 203c. As the elastic parts 203a and 203b which are shaped as the letter "S" alternately bend the bend connecting part 203c, the movable part 201 may move in the second direction ② while one surface of the movable part 201 remains perpendicular to the second direction ②. As one surface of the movable part 201 remains perpendicular to the second direction ②, the plurality of contacting parts 211 may remain in the position where they contact the connecting part 50. As the plurality of contacting parts 211 maintain the position where they contact the connecting part 50, the plurality of contacting parts 211 may be prevented from damaging the surface of the connecting part 50.

Figure 13:
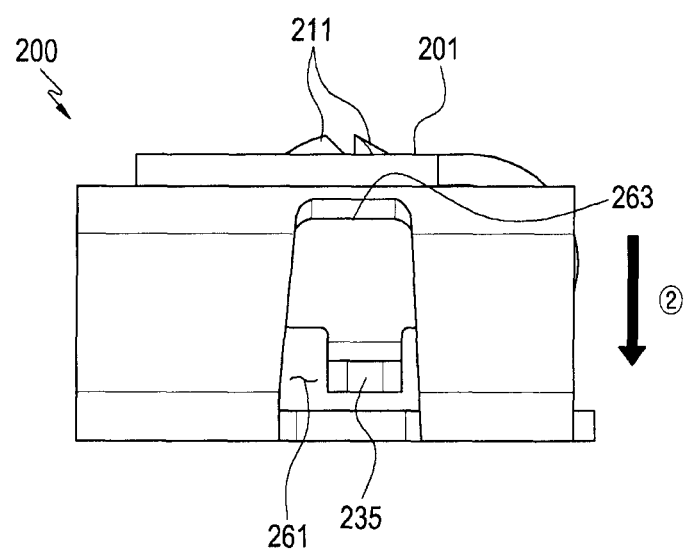
FIG. 13 is a side view illustrating a connecting device included in an electronic device, which has been pressed in the second direction, according to an embodiment of the present disclosure.

FIG. 13 is a side view illustrating a connecting device 200 included in an electronic device (e.g., the electronic device 101 of FIG. 2), pressed in the second direction ②, according to an embodiment of the present disclosure.

Referring to FIG. 13, where the movable part 201 is pressed in the second direction ②, the tab 235 may be moved through the opening 261 in the second direction ②. According to an embodiment of the present disclosure, the width of the opening 261 may correspond to the width of the tab 235.

Figure 14:
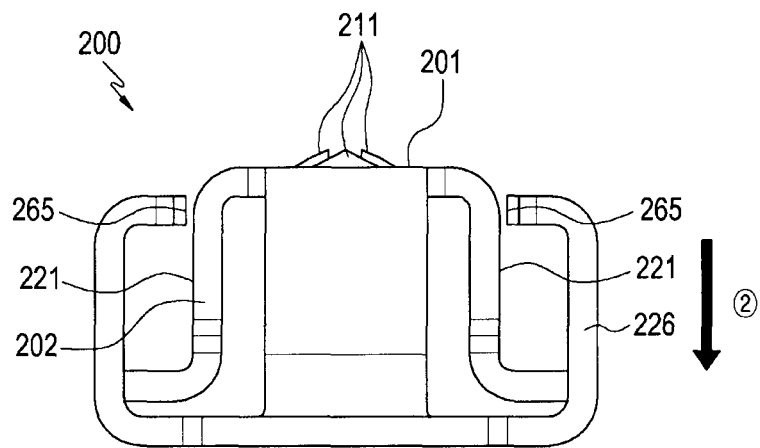
FIG. 14 is a side view illustrating a connecting device included in an electronic device, which has been pressed in the second direction, as viewed in a different direction, according to an embodiment of the present disclosure.

FIG. 14 is a side view illustrating a connecting device 200 included in an electronic device (e.g., the electronic device 101 of FIG. 2), pressed in the second direction ②, as viewed in a different direction, according to an embodiment of the present disclosure.

Referring to FIG. 14, the second protecting wall 206 may include a guide 265. The guide 265 may project towards the first protecting wall 202 while abutting one surface 221 of the first protecting wall 202. As the first protecting wall 202 is guided by the guide 265 and moved along the second direction ②, the first protecting wall 202 may be prevented from moving in directions different from the second direction ② or the first direction ①.

Figure 15:
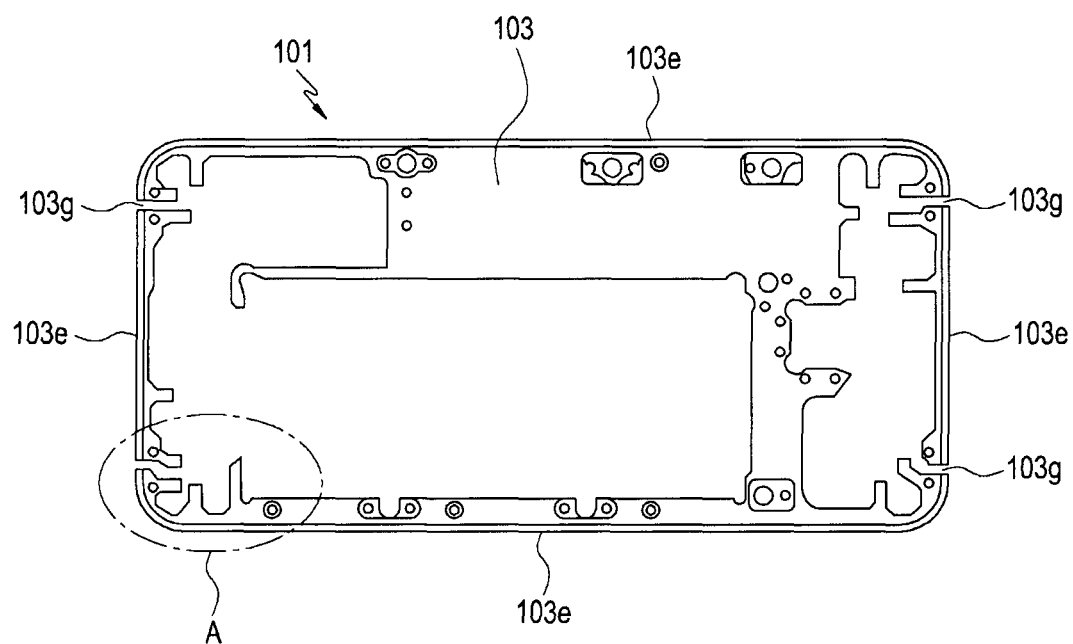
FIG. 15 is a plan view illustrating an inside of an electronic device according to an embodiment of the present disclosure.

FIG. 15 is a plan view illustrating an inside of an electronic device (e.g., the electronic device 101 of FIG. 2) according to an embodiment of the present disclosure.

Referring to FIG. 15, according to an embodiment of the present disclosure, an electronic device (e.g., the electronic device 101 of FIG. 2) may include a conductive housing 103, and the housing 103 may include side parts 103e. According to an embodiment of the present disclosure, the side parts 103e may be disconnected from each other by separators 103g. The side parts 103e may be utilized as an antenna radiator for wireless communication.

Figure 16:
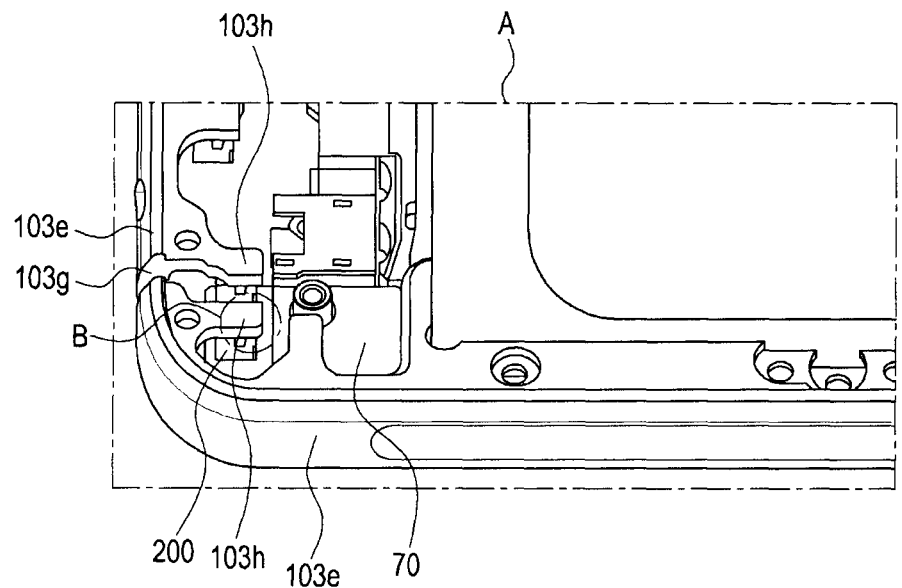
FIG. 16 is an enlarged view illustrating portion A of FIG. 15 according to an embodiment of the present disclosure.

FIG. 16 is an enlarged view illustrating portion A of FIG. 15 according to an embodiment of the present disclosure.

Figure 17:
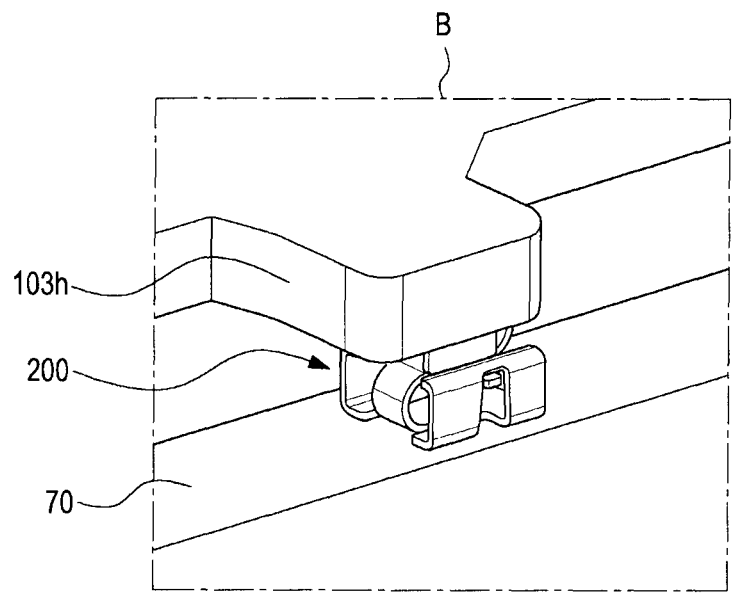
FIG. 17 is an enlarged view illustrating portion B of FIG. 16 according to an embodiment of the present disclosure.

FIG. 17 is an enlarged view illustrating portion B of FIG. 16 according to an embodiment of the present disclosure.

Referring to FIGS. 16 and 17, the side parts 103e may include connecting parts 103h (e.g., the connecting parts 40 of FIG. 4) that protrude to the inside of the housing (e.g., the housing 103 of FIG. 15). According to an embodiment of the present disclosure, the connecting device 200 may electrically connect the connecting parts 103h with the circuit board 70.

Figure 18:
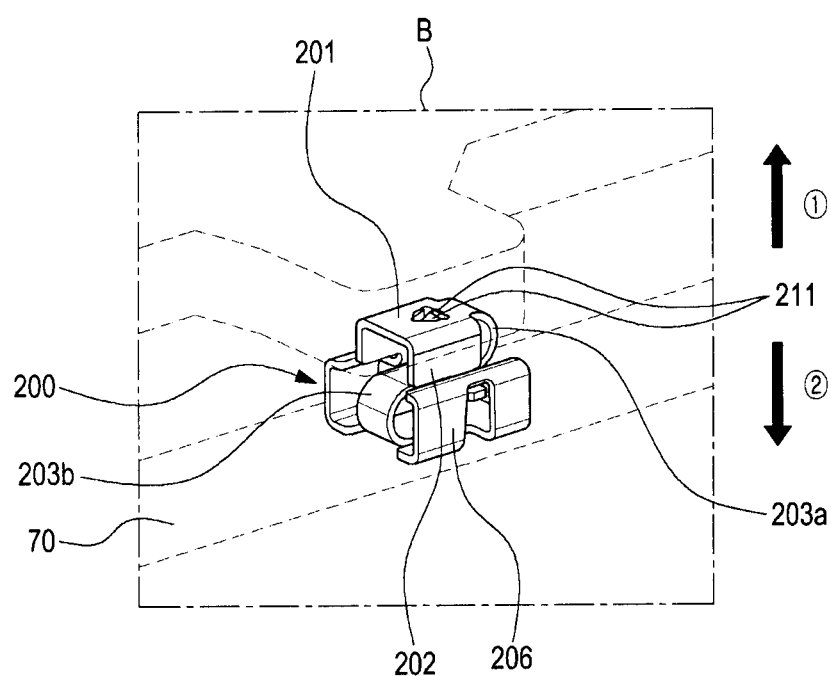
FIG. 18 is a view illustrating an example in which a side part of an electronic device contacts a connecting device according to an embodiment of the present disclosure.

FIG. 18 is a view illustrating an example in which a side part of an electronic device (e.g., the electronic device 101 of FIG. 2) contacts a connecting device according to an embodiment of the present disclosure.

Referring to FIG. 18, where the connector part 103h moves, the connecting part 103h may press the connecting device 200 in the second direction ② or pull the connecting device 200 in the first direction ①. Even where the connecting device 200 is pressed in the second direction ② or pulled in the first direction ①, the plurality of electrical contacts 211 may maintain the position of contact of the connecting part 103h. As the plurality of electrical contacts 211 maintain the position of contact with the connecting part 103h, the plurality of electrical contacts 211 may be prevented from damaging the surface of the connecting part 103h.

Figure 19:
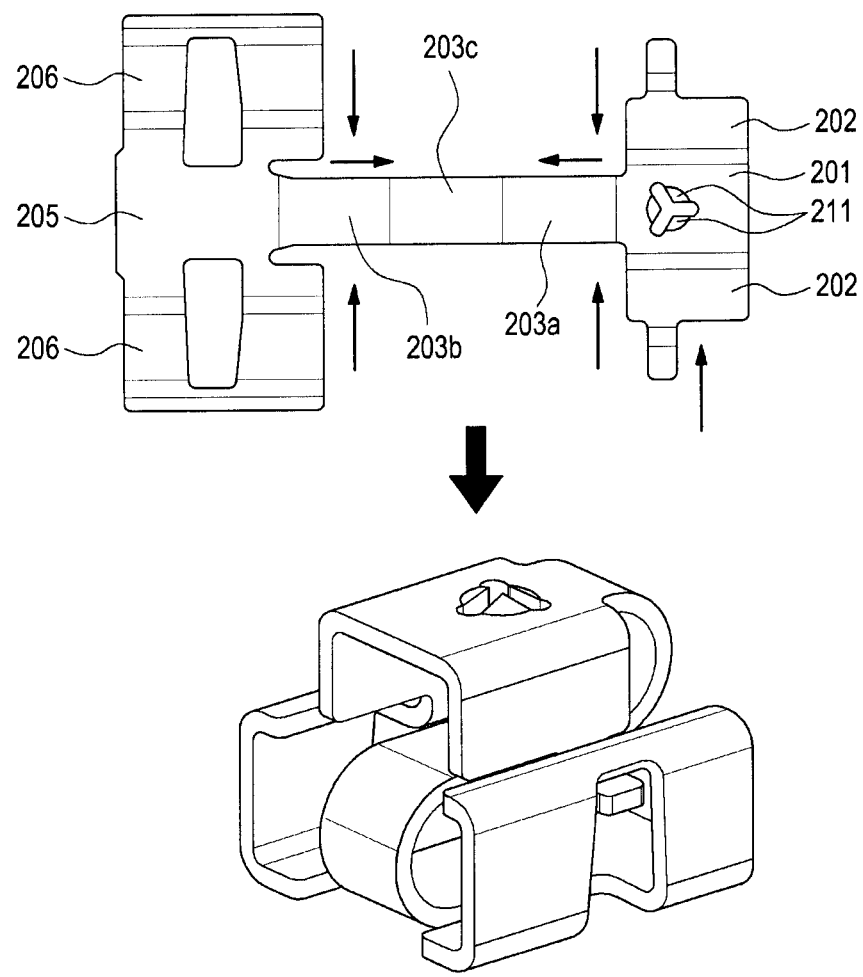
FIG. 19 is an exploded view illustrating a connecting device included in an electronic device, before assembled, according to an embodiment of the present disclosure.

FIG. 19 is an exploded view illustrating a connecting device 200 included in an electronic device (e.g., the electronic device 101 of FIG. 2), before assembled, according to an embodiment of the present disclosure.

Referring to FIG. 19, the connecting device 200 may include a movable part 201 including a plurality of contacting parts 211, first protecting walls 202, a plurality of elastic parts 203a and 203b, a support 205, and second protecting walls 206. The movable part 201 may be integrally formed with the first protecting walls 202 and may also be integrally formed with the elastic parts 203. The elastic parts 203 may be integrally formed with the support 205 and may also be integrally formed with the second protecting walls 206. In the connecting device 200, the movable part 201, the first protecting walls 202, the plurality of elastic parts 203a and 203b, the support 205, and the second protecting walls 206 each may be bent, allowing the connecting device 200 a stereoscopic shape.

Figure 20:
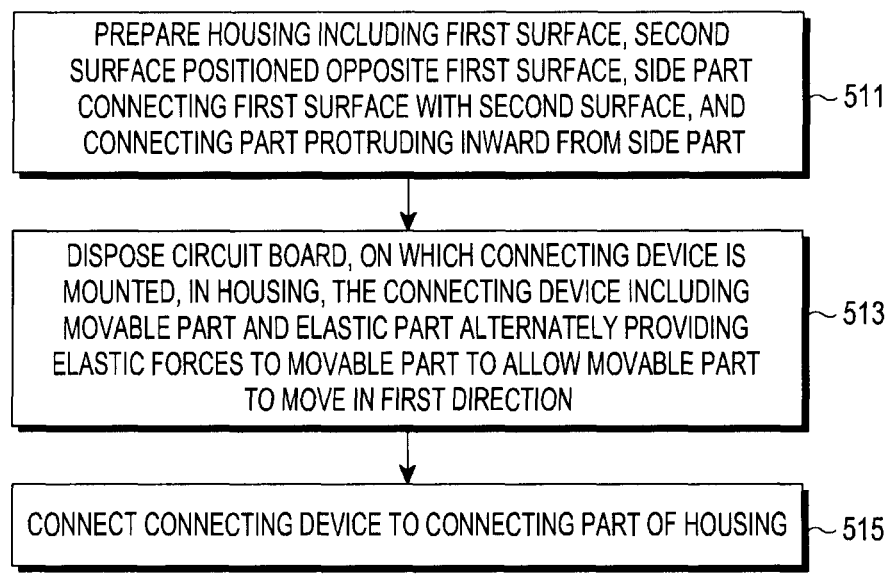
FIG. 20 is a flowchart illustrating a method of operating a connecting device included in an electronic device according to an embodiment of the present disclosure.

FIG. 20 is a flowchart illustrating a method for manufacturing a connecting device (e.g., the connecting device 200 of FIG. 18) included in an electronic device (e.g., the electronic device 101 of FIG. 2) according to an embodiment of the present disclosure.

Referring to FIG. 20, a housing (e.g., the housing 103 of FIG. 2) may be prepared (511) that includes a first surface (e.g., the first surface 103a of FIG. 2), a second surface (e.g., the second surface 103b of FIG. 3) which is positioned opposite the first surface, a side part (e.g., the side part 103e of FIG. 15) connecting the first surface with the second surface, and a connecting part (e.g., the connecting part 103h of FIG. 16) protruding inward from the side part.

A circuit board (e.g., the circuit board 70 of FIG. 16) on which a connecting device (e.g., the connecting device 200 of FIG. 18) is mounted may be disposed (513) in a housing (e.g., the housing 103 of FIG. 3), the connecting device including a movable part (e.g., the movable part 201 of FIG. 18) and elastic parts (e.g., the elastic parts 203a and 203b of FIG. 18) alternately providing elastic forces to allow the movable part to move in the first direction.

The connecting device (e.g., the connecting device 200 of FIG. 18) may be connected to the connecting part (e.g., the connecting part 103h of FIG. 16) of the housing (515).

Figure 21:
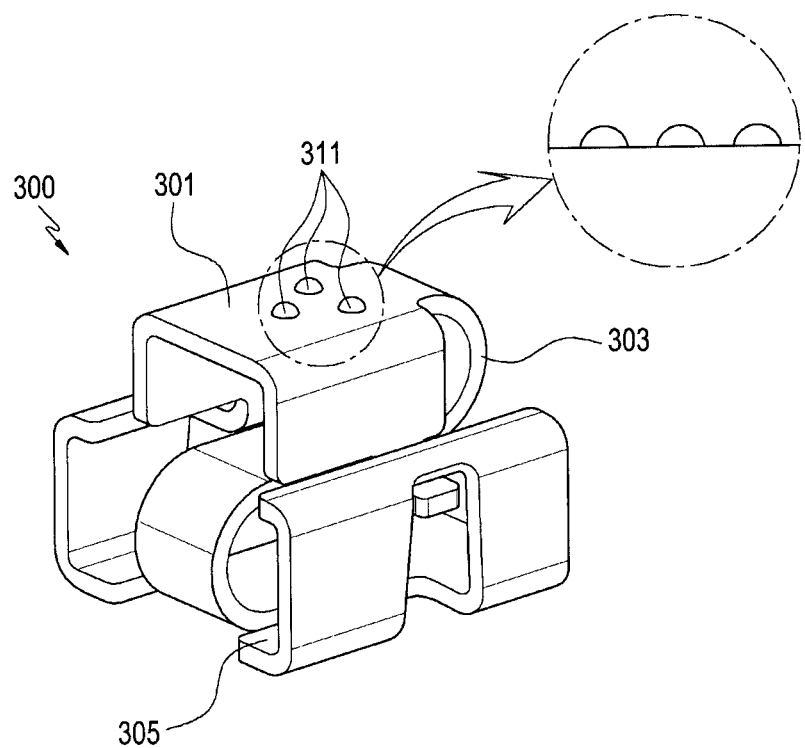
FIG. 21 is a perspective view illustrating a connecting device included in an electronic device according to an embodiment of the present disclosure.

FIG. 21 is a perspective view illustrating a connecting device 300 included in an electronic device (e.g., the electronic device 101 of FIG. 2) according to an embodiment of the present disclosure.

Referring to FIG. 21, according to an embodiment of the present disclosure, a connecting device 300 included in an electronic device (e.g., the electronic device 101 of FIG. 2) may include a movable part 301 including a plurality of electrical contacts 311, a plurality of elastic parts 303a and 303b, and a support 305.

According to an embodiment of the present disclosure, the plurality of electrical contacts 311 may semi-spherically protrude from one surface of the movable part 301. For example, the plurality of electrical contacts 311 may be formed by pressing on one surface of the movable part 301 using a press.

Figure 22:
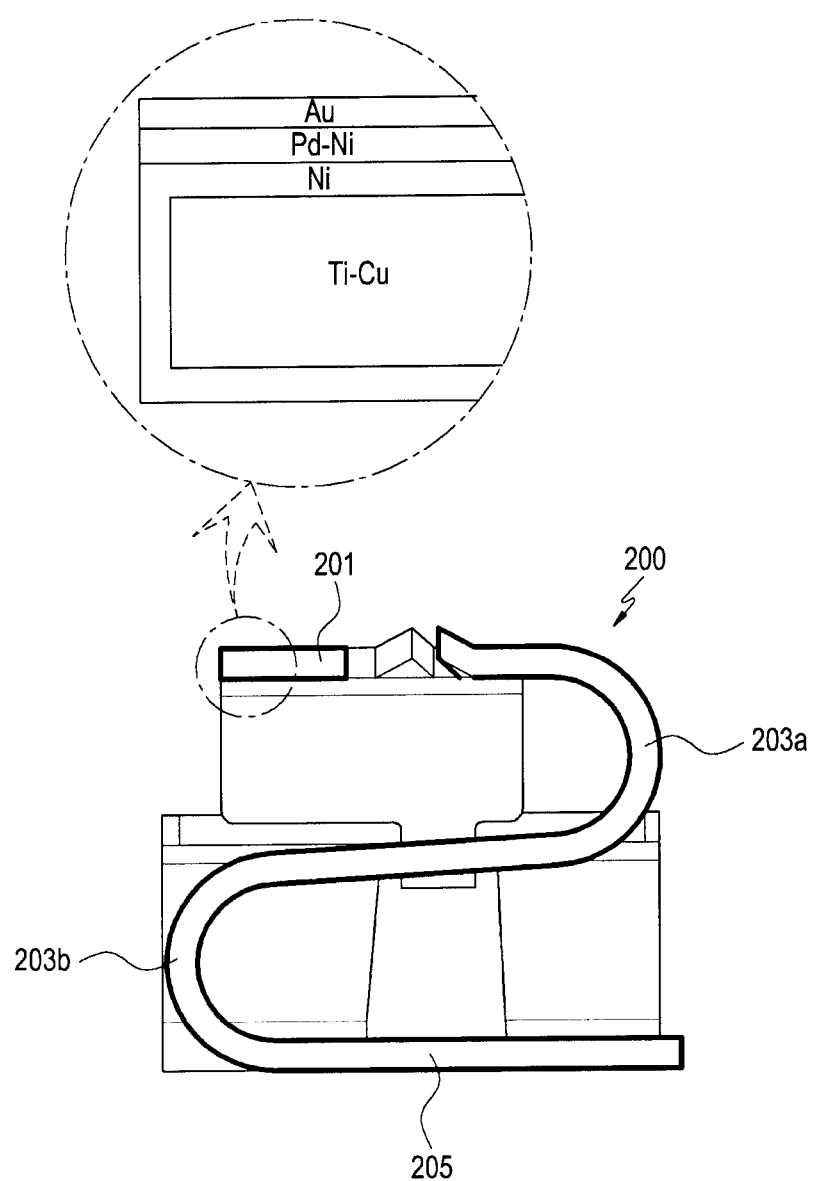
FIG. 22 is a view illustrating a material of a connecting device included in an electronic device according to an embodiment of the present disclosure.

FIG. 22 is a view illustrating a material of a connecting device (e.g., the connecting device 200 of FIG. 4) included in an electronic device (e.g., the electronic device 101 of FIG. 2) according to an embodiment of the present disclosure.

Referring to FIG. 22, the movable part 201 of the contacting part 201 may be formed of a stack of titanium (Ti)-copper (Cu), nickel (Ni), palladium (Pd)—Ni, and gold (Au) layers. For example, the movable part 201 may include a base body formed of Ti—Cu, and the Ti—Cu base body may be plated with a Ni layer that is 1.5 μm to 4.0 μm thick, a Pd—Ni layer that is about 0.2 μm thick, and an Au layer that 0.05 μm thick.

According to an embodiment of the present disclosure, the support 205 may be formed of a stack of Ti—Cu, Ni, and Au layers. For example, the support 205 may include a base body formed of Ti—Cu, and the Ti—Cu base body may be plated with a Ni layer that is 1.5 μm to 4.0 μm thick, a Ni layer that is 1.5 μm to 4.0 μm thick, and an Au layer that 0.05 μm thick.

According to an embodiment of the present disclosure, at least one of the elastic part 203, the first protecting wall 202, and the second protecting wall 206 may include a Ti—Cu base body, and the Ti—Cu base body may be plated with a Ni layer that 1.5 μm to 3.5 μm thick.

As set forth above, according to an embodiment of the present disclosure, a connecting device may comprise a movable part including at least one electrical contact, an elastic part connected and extending from the movable part and including a plurality of bends alternately arranged to allow the movable part to move in a first direction, and a support extending from the elastic part.

According to an embodiment of the present disclosure, the movable part may include a plurality of electrical contacts.

According to an embodiment of the present disclosure, the elastic part may have an S shape.

According to an embodiment of the present disclosure, wherein the movable part comprises a protecting wall extending in a second direction that is opposite to the first direction.

According to an embodiment of the present disclosure, the connecting device may further comprise at least one second protecting wall extending from the support in the first direction.

According to an embodiment of the present disclosure, the connecting device may further comprise a tab configured to restrict the elastic part from floating.

According to an embodiment of the present disclosure, the connecting device may include an opening formed in the second protecting wall and having a lengthwise direction along the first direction up to a ledge, and wherein the tab extends from the first protecting wall and moving along the opening, and is obstructed by the ledge.

According to an embodiment of the present disclosure, as the first protecting wall is moved along the second protecting wall in the first direction or the second direction, one surface of the movable part may remain perpendicular to the first direction.

According to an embodiment of the present disclosure, the second protecting wall may include a guide projecting towards the first protecting wall, and the first protecting wall may be moved along the guide in the first direction or the second direction.

According to an embodiment of the present disclosure, the number of the plurality of bends may be an even number.

According to an embodiment of the present disclosure, the at least one electrical contact may protrude from one surface of the movable part.

According to an embodiment of the present disclosure, the one surface of the movable part may be configured to be separated from an external object.

According to an embodiment of the present disclosure, the movable part, the support, and the elastic part may be formed of a conductive material.

According to an embodiment of the present disclosure, the movable part may include a titanium (Ti)-copper (Cu) layer, a nickel (Ni) layer, a palladium (Pd)—Ni layer, and a gold (Au) layer.

According to an embodiment of the present disclosure, the support may include a Ti—Cu layer, an Ni layer, and an Au layer.

According to an embodiment of the present disclosure, one surface of the movable part may be pulled to remain perpendicular to the first direction by an elastic force of the elastic part.

According to an embodiment of the present disclosure, an electronic device including a connecting device may comprise a housing including a first surface, a second surface positioned opposite the first surface, and a side part connecting the first surface with the second surface, a connecting part protruding from the side part to an inside of the housing, a circuit board disposed inside the housing, and the connecting device electrically connecting the connecting part with the circuit board, wherein the connecting device may include a movable part including at least one electrical contact, an elastic part connected and extending from the movable part and including a plurality of bends alternately arranged to allow the movable part to move in a first direction, and a support extending from the elastic part.

According to an embodiment of the present disclosure, the side part may be an antenna radiator for wireless communication.

According to an embodiment of the present disclosure, the moving part may further include at least one first protecting wall extending from the movable part in a second direction that is opposite to the first direction and at least one second protecting wall extending from the support along the first direction.

According to an embodiment of the present disclosure, a method for manufacturing an electronic device including a connecting device may comprise preparing a housing including a first surface, a second surface positioned opposite the first surface, a side part connecting the first surface with the second surface, and a connecting part protruding inward from the side part, disposing a circuit board, on which the connecting device is mounted, in the housing, the connecting device including a movable part and an elastic part configured to alternately provide elastic forces to the movable part in a first direction to allow the movable part to move in the first direction, and connecting the connecting device to the connecting part of the housing.

As is apparent from the foregoing description, according to various embodiments of the present disclosure, in the connecting device, the elastic parts may alternately provide elastic forces to the movable part, restricting the horizontal movement of the contacting part while allowing for its vertical movement and hence mitigating wear to the surface of the connecting part by the plurality of contacting parts.

According to various embodiments of the present disclosure, in the connecting device, the movable part includes a plurality of contacting parts, and although some of the contacting parts corrode, the contact to the connecting part may remain stable via the remaining non-corroded contacting parts.

While the present disclosure has been shown and described with reference to exemplary embodiments thereof, it will be apparent to those of ordinary skill in the art that various changes in form and detail may be made thereto without departing from the spirit and scope of the present disclosure as defined by the following claims.

What is claimed is:

1. A connecting device, comprising:
a movable part including at least one contacting part;
an elastic part extending from the movable part and including a plurality of bends alternately arranged to allow the movable part to move in a first direction;
a support extending from the elastic part; and
an anti-floating part configured to restrict the elastic part from floating,
wherein the movable part comprises at least two first protecting walls extending in a second direction that is opposite to the first direction, wherein the at least two first protecting walls are disposed around both side surfaces of the elastic part for protecting the elastic part from external impact,
wherein the support comprises at least two second protecting walls extending from the support in the first direction, wherein the at least two second protecting walls are disposed around both side surfaces of the elastic part, and
wherein the anti-floating part includes an opening formed in the at least two second protecting walls and having a lengthwise direction along the first direction, a first hanging part extending from the at least two first protecting walls and moving along the opening, and a second hanging part extending from the at least two second protecting walls and having the first hanging part stuck thereto.

2. The connecting device of claim 1, wherein the movable part includes a plurality of contacting parts.

3. The connecting device of claim 1, wherein the elastic part has an S shape.

4. The connecting device of claim 1, wherein as the at least two first protecting walls are moved along the at least two second protecting walls in the first direction or the second direction, one surface of the movable part remains perpendicular to the first direction.

5. The connecting device of claim 4, wherein the at least two second protecting walls includes a guide projecting towards the at least two first protecting walls and wherein the at least two first protecting walls are moved along the guide in the first direction or the second direction.

6. The connecting device of claim 1, wherein the number of the plurality of bends is an even number.

7. The connecting device of claim 1, wherein the at least one contacting part protrudes from one surface of the movable part.

8. The connecting device of claim 7, wherein the one surface of the movable part is configured to be separated from an external object.

9. The connecting device of claim 1, wherein the movable part, the support, and the elastic part are formed of a conductive material.

10. The connecting device of claim 9, wherein the movable part includes a titanium (Ti)-copper (Cu) layer, a nickel (Ni) layer, a palladium (Pd)-Ni layer, and a gold (Au) layer.

11. The connecting device of claim 9, wherein the support includes a Ti—Cu layer, a Ni layer, and an Au layer.

12. The connecting device of claim 1, wherein one surface of the movable part is pulled to remain perpendicular to the first direction by an elastic force of the elastic part.

13. An electronic device including a connecting device, the electronic device comprising:
- a housing including a first surface, a second surface positioned opposite the first surface, and a side part connecting the first surface with the second surface;
- a connecting part protruding from the side part to an inside of the housing;
- a circuit board disposed inside the housing;
- the connecting device electrically connecting the connecting part with the circuit board, wherein the connecting device includes a movable part including at least one contacting part, an elastic part extending from the movable part and including a plurality of bends alternately arranged to allow the movable part to move in a first direction, and a support extending from the elastic part; and
- an anti-floating part configured to restrict the elastic part from floating,
- wherein the movable part comprises at least two first protecting walls extending in a second direction that is opposite to the first direction, wherein the at least two first protecting walls are disposed around both side surfaces of the elastic part for protecting the elastic part from external impact,
- wherein the support comprises at least two second protecting walls extending from the support in the first direction, wherein the at least two second protecting walls are disposed around both side surfaces of the elastic part, and
- wherein the anti-floating part includes an opening formed in the at least two second protecting walls and having a lengthwise direction along the first direction, a first hanging part extending from the at least two first protecting walls and moving along the opening, and a second hanging part extending from the at least two second protecting walls and having the first hanging part stuck thereto.

14. The electronic device of claim 13, wherein the side part is an antenna radiator for wireless communication.

15. The electronic device of claim 13, wherein the connecting device further includes the at least two first protecting walls extending from the movable part in the second direction that is opposite to the first direction and the at least two second protecting walls extending from the support along the first direction.

16. A method for manufacturing an electronic device including a connecting device, the method comprising:
- preparing a housing including a first surface, a second surface positioned opposite the first surface, a side part connecting the first surface with the second surface, and a connecting part protruding inward from the side part;
- disposing a circuit board, on which the connecting device is mounted, in the housing, the connecting device including a movable part and an elastic part configured to alternately provide elastic forces to the movable part to allow the movable part to move in a first direction;
- connecting the connecting device to the connecting part of the housing; and
- restricting the elastic part from floating with an anti-floating part including an opening formed in at least two second protecting walls and having a lengthwise direction along the first direction, a first hanging part extending from the at least two first protecting walls and moving along the opening, and a second hanging part extending from the at least two second protecting walls and having the first hanging part stuck thereto,
- wherein the movable part comprises at least two first protecting walls extending in a second direction that is opposite to the first direction, wherein the at least two first protecting walls are disposed around both side surfaces of the elastic part for protecting the elastic part from external impact,
- wherein the connecting device includes a support extending from the elastic part, the support comprises at least two second protecting walls extending from the support in the first direction, wherein the at least two second protecting walls are disposed around both side surfaces of the elastic part.

* * * * *